United States Patent
Hose, Jr. et al.

(10) Patent No.: US 7,126,861 B2
(45) Date of Patent: Oct. 24, 2006

(54) PROGRAMMABLE CONTROL OF LEAKAGE CURRENT

(75) Inventors: Richard K. Hose, Jr., Aloha, OR (US); Shigeki Shimomura, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 211 days.

(21) Appl. No.: 10/749,287

(22) Filed: Dec. 30, 2003

(65) Prior Publication Data

US 2005/0146948 A1 Jul. 7, 2005

(51) Int. Cl.
*G11C 16/04* (2006.01)
*G11C 11/00* (2006.01)

(52) U.S. Cl. .................. 365/189.09; 365/154

(58) Field of Classification Search ........... 365/189.09, 365/230.05, 154, 156
See application file for complete search history.

(56) References Cited

U.S. PATENT DOCUMENTS

| | | | |
|---|---|---|---|
| 5,986,923 A * | 11/1999 | Zhang et al. ............... | 365/154 |
| 6,166,985 A | 12/2000 | McDaniel et al. | |
| 6,169,419 B1 | 1/2001 | De et al. | |
| 6,515,513 B1 * | 2/2003 | Ye et al. ..................... | 326/83 |
| 6,639,827 B1 | 10/2003 | Clark et al. | |
| 6,643,173 B1 * | 11/2003 | Takemura ............... | 365/185.05 |
| 6,674,670 B1 * | 1/2004 | Jeung .................... | 365/189.01 |

OTHER PUBLICATIONS

Agarwal, Amit, et al., "A Single-Vt Low-Leakage Gated-Ground Cache for Deep Submicron," IEEE Journal of Solid-State Circuits, vol. 38, No. 2, Feb. 2003, pp. 319-328.

* cited by examiner

*Primary Examiner*—Anh Phung
(74) *Attorney, Agent, or Firm*—Schwab, Williamson & Wyatt, P.C.

(57) ABSTRACT

An apparatus having a memory cell, a ground control circuitry coupled to the memory cell to programmably control a voltage at a first ground, a first circuitry coupled to the memory cell to provide a first voltage to the memory cell during a first period, and a second circuitry coupled to the memory cell to provide a second voltage to memory cell during a second period, is described. In various embodiments, the first voltage is reference to the first ground; and the second voltage is referenced to a second ground which is different from the first ground.

14 Claims, 7 Drawing Sheets

PROGRAMMABLE CONTROL OF LEAKAGE CURRENT

BACKGROUND

1. Field of the Invention

This disclosure relates to integrated circuit design, and, more particularly to memory design.

2. Description of the Related Art

To obtain higher performance and increased integration levels in today's circuit designs, feature sizes are becoming ever smaller. These smaller feature sizes have lead to reduced gate oxide thickness and reduced threshold voltages. The reduced gate oxide thickness and reduced threshold voltages have resulted in increases in both gate leakage and sub-threshold leakage currents. This, in turn, has resulted in an increase in power consumption in circuits utilizing these smaller feature sizes.

BRIEF DESCRIPTION OF THE DRAWINGS

Embodiments of the present invention will be described referencing the accompanying drawings in which like references denote similar elements, and in which.

DETAILED DESCRIPTION OF THE EMBODIMENTS

Current leakage in circuits utilizing advanced processing techniques has become significant. The types of leakage current are varied, but two commonly addressed forms of leakage current are gate leakage and sub-threshold leakage currents. For these leakage currents, supply voltage may be a factor in the amount of current leakage that occurs. For example, in an 8 megabyte (MB) array with a supply voltage of 1.25 volts (V), the power loss due to leakage current may be as much as 12 watts (W). However, by reducing the supply voltage by 0.22 V, the power loss due to leakage current may be reduced to 7 W. Thus, a modest reduction in the supply voltage associated with a memory array may save significant power that would otherwise be lost due to leakage current. Resultantly, one way to effect a decrease in current leakage may be to modify the supply voltage. Embodiments described herein advantageously provide an ability to programmably modify the "effective" supply voltage of a memory cell.

Figure 1:
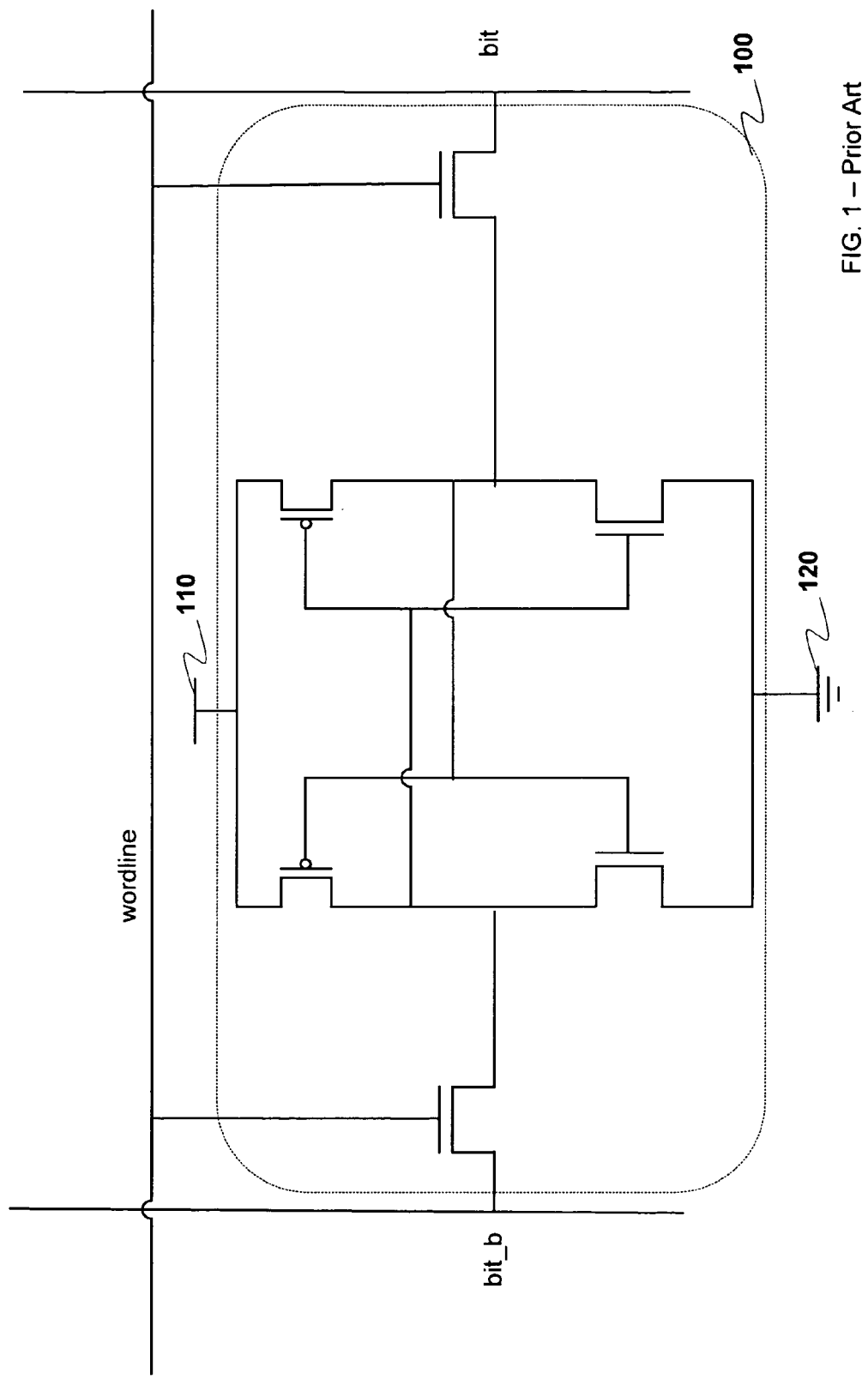
FIG. 1 illustrates a prior art memory cell.

FIG. 1 illustrates a prior art memory cell 100. This memory cell 100 is a 6 T memory cell for storing a bit of information. The memory cell 100 has a voltage "across" the memory cell 100 that is the difference between a first voltage at a first node 110 and a second voltage at a second node 120. If the first voltage is a system supply voltage, $V_{cc}$, and the second voltage is a system ground, e.g. the reference voltage for the measurement of $V_{cc}$, then the voltage "across" the memory cell 100 is $V_{cc}$. However, if the second voltage at the second node 120 is at a value higher then the system ground voltage, e.g. by 0.2 volts, then the voltage "across" the memory cell 100 will be $V_{cc}$–0.2

The embodiments described herein provide a programmable ability to modify a ground reference voltage, e.g. create a programmable virtual ground, to alter the voltage across the memory cells. While the memory cell discussed herein is a 6T memory cell, it will be appreciated by those skilled in the art that the method and apparatus disclosed herein may also apply to other memory devices.

Figure 2:
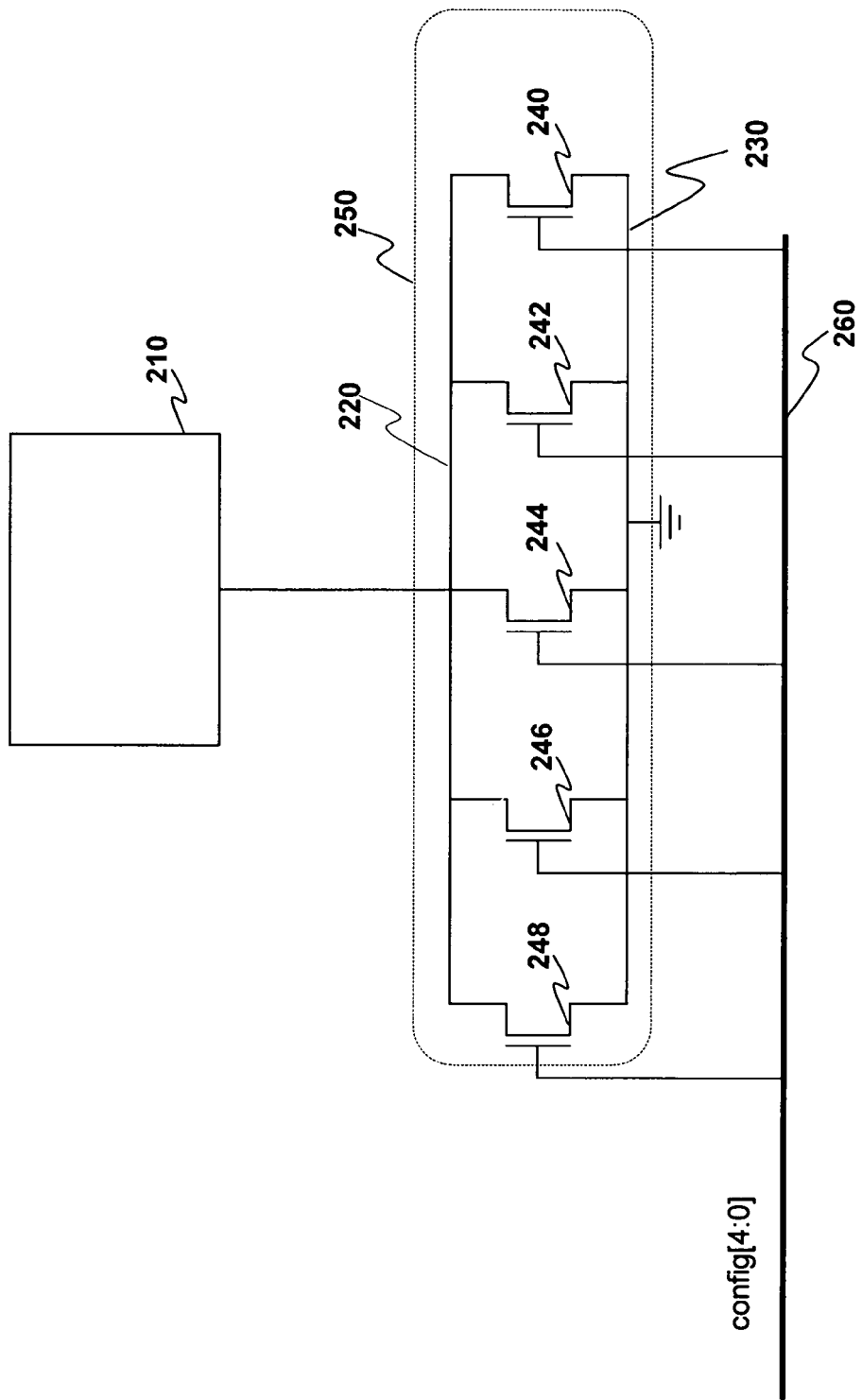
FIG. 2 illustrates a circuit for providing a programmable virtual ground, in accordance with one embodiment.

FIG. 2 illustrates a circuit for providing a programmable virtual ground, in accordance with one embodiment. A plurality of memory cells 210 are coupled to a programmable virtual ground 220. The programmable virtual ground 220 is coupled to a system ground 230 through a plurality of transistors 250 comprising programmable ground control circuitry. In the embodiment illustrated, the plurality of transistors 250 are configured via configuration bits config [4:0] 260. By selectively turning the plurality of transistors 250 on and off, as described subsequently, a variable resistance may be obtained.

Figure 3A:
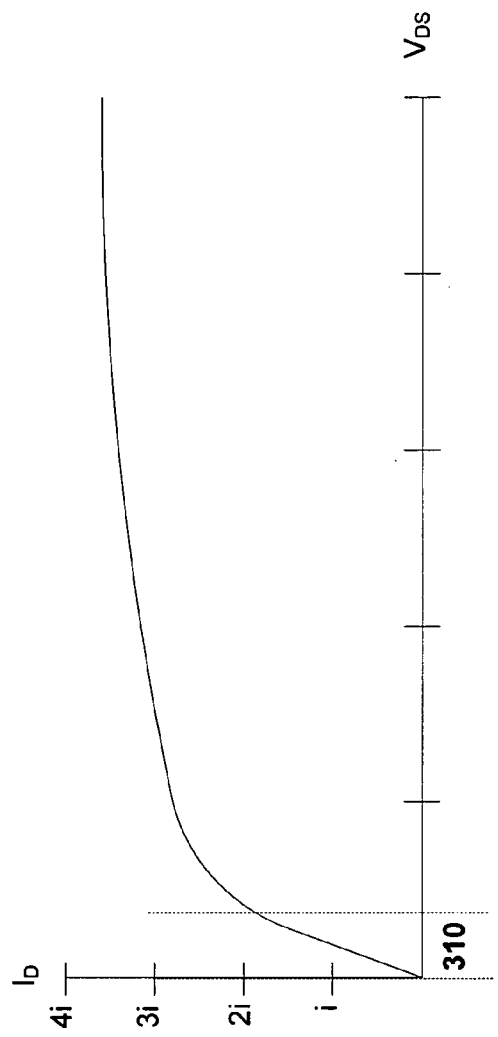
FIGS. 3A–3B illustrate $I_D$–$V_{DS}$ characteristics for two n-MOSFET transistor devices.
Figure 3B:
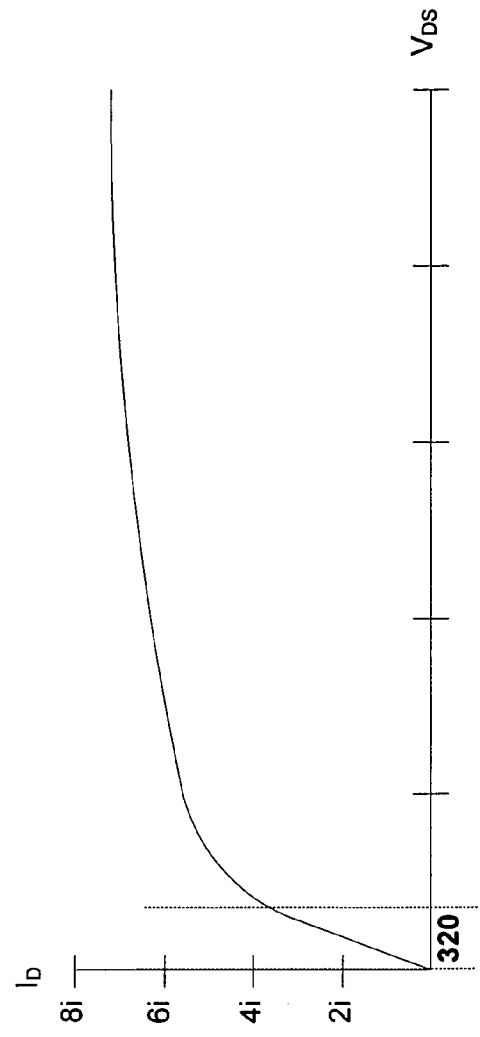

In one embodiment, transistors 250 may be MOSFET transistor devices. Illustrated in FIG. 3A-3B are $I_D$–$V_{DS}$ characteristics for two n-MOSFET transistor devices. When the devices are operated in their linear regions 310–320, the devices act like resistors. Illustrated in FIG. 3A is a characteristic for a first transistor with a first channel width causing the first transistor to exhibit a first resistive value, as indicated by its linear region 310. Illustrated in FIG. 3B is a characteristic for a second transistor with a second channel width causing the second transistor to exhibit a second resistive value, as indicated by its linear region 320. The characteristics having the same $V_{DS}$ scale with different $I_D$ scales.

Referring again to FIG. 2, each of the transistors 240–248 comprising the programmable ground control circuitry may be fabricated to have a particular resistance when operating in a linear region. For example, the plurality of transistors can be "binary weighted" transistors which are enable by binary coded signals. While the resistance of a transistor may be a function of process parameters such as mobility and gate oxide thickness, resistance variances of transistors may be effected through modulation of the channel width. That is, a first transistor 240 may have a channel width that produces a resistance of R. By modifying the channel width of the other transistors relative to the first transistor, transistors with resistance values of 2R 242, 4R 244, 8R 246 and 16R 248 may be formed. In this manner, by providing a binary value on configuration bits 260, a programmable resistance may be obtained by selectively choosing the parallel combination of resistively operating transistors. For example, by providing a binary "5", 00101, on configuration bits 260, an effective resistance may be obtained that results in a 0.2 volt drop across the parallel transistors 250. This 0.2 volt drop occurs as a result of two of the transistors conducting and operating in the linear region, corresponding to the two transistors provided with logic 1's to the transistor's gate. In alternate embodiments, the channel length may be modulated to obtain the various resistances.

Binary weighted transistors and corresponding coding provides a relatively area efficient implementation. However, other forms of coding may be utilized in the design of the programmable ground control circuitry. In one embodiment, linearly weighted transistors may be utilized. In such an embodiment, thermometer coding, e.g. where a number of ones or zeros represents the resistance value, may be utilized in enabling the linearly weighted transistors. By using thermometer coding, glitches may be reduced by having one bit change at a time. It will be appreciated by those who skilled in the arts that other coding techniques may be used as appropriate.

Note the current flowing through the transistors that produces the voltage drop is the leakage current for the set of memory cells whose voltage is reduced by the programmable transistors. Thus, the presence of the transistors provides negative feedback to the leakage current. This may be beneficial under various conditions. For example, leakage current is a function of temperature. Thus, as a device containing the resistive transistor formation heats up, the leakage current will increase. This, in turn, causes the voltage drop across the resistive transistor formation to increase, thus reducing the supply voltage and in turn, the leakage current.

While reducing the voltage across memory cells may reduce the current consumption, it may produce undesirable effects. For example, if a lower voltage is applied across a memory device during read and write operations, this lower supply voltage may cause a memory cell to become unstable. As a result of manufacturing variances that occur during the manufacturing process, various parameters of the transistors comprising a memory cell will differ. This may result in a memory cell having a preferred state. This preferred state may not be sufficient to cause problems in a normal operating range for the memory cell. However, when the voltage across a memory cell is reduced and a read and/or write operation is performed, this may cause the memory cell to become unstable and possibly, incorrectly, change state to its preferred state. Thus, it may be desirable to maintain two different voltages across a memory cell; one voltage during read and write operations and a second voltage when the cell is not being read from or written to.

Figure 4:
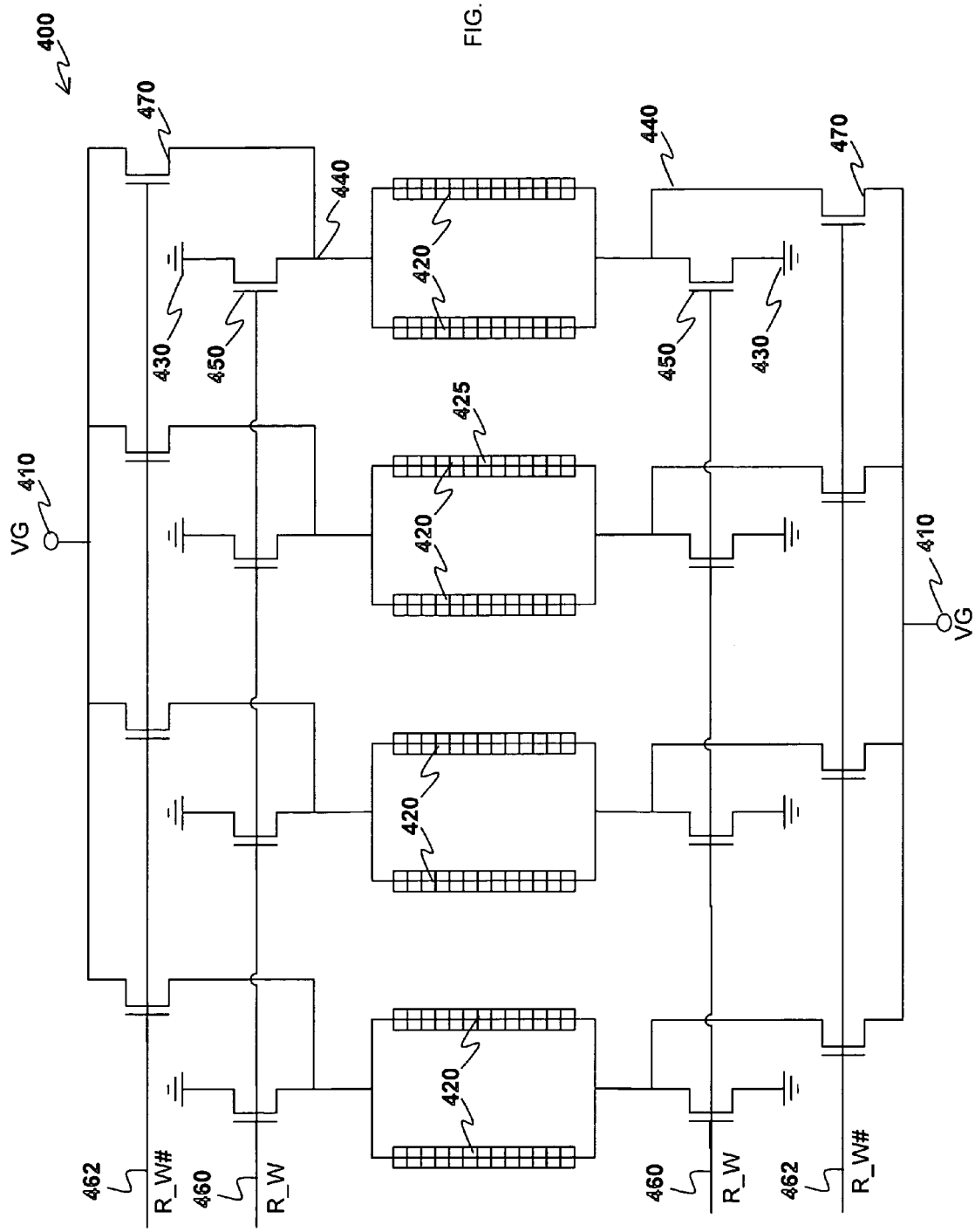
FIG. 4 illustrates a portion of a memory array with multiple effective supply voltages, in accordance with one embodiment.

FIG. 4 illustrates a portion 400 of a memory array with multiple effective supply voltages, in accordance with one embodiment. The multiple "effective" supply voltages are provided by utilizing one supply voltage (not illustrated) and two grounds 430 and 410. The multiple supply voltages may be applied to the memory cells at different time. For example, in one embodiment, two "effective" supply voltages may exist. The first supply voltage may be applied to a memory cell during periods of access (e.g. reads from or writes to) of the memory cell. The second supply voltage may be applied to the memory cell during periods of non-access (e.g. when the memory cell is not being written to or read from) of the memory cell. The first ground utilized is a system ground 430 that is used to reference ground for the supply voltage. The second ground utilized is a global virtual ground 410. The programmable virtual ground 410 is connected to programmable ground control circuitry (not illustrated).

FIG. 4 illustrates pairs 420 of columns 425 of memory cells, such as the 6T memory cells discussed above. Each pair 420 of columns 425 of memory cells has a local ground 440 common to both columns. When a read or write operation is performed, the R_W 460 signal goes active to discharge the local grounds 440 to the system ground 430 through N-MOSFETs 450. Also during the read or write operation, the R_W# 462 signal goes inactive to isolate the local grounds 440 from the programmable virtual ground 410 through N-MOSFETs 470. This isolation prevents the pull-down transistors 450 on the local ground nodes 440 from disturbing the programmable virtual ground 410. As previously discussed, the local grounds 440 are discharged to prevent possibly memory stability problems during read or write operations. The discharge 450 and isolation 470 transistors are duplicated at the top and bottom of the columns. This parallel combination may reduce voltage drops by reducing, among other things, resistance associated with additional interconnect that would be required to route to single transistors. In addition, the top and bottom programmable virtual grounds are connected periodically after a number of columns.

After a memory access (e.g. a read or a write), the previously discharged local grounds 440 will be allowed to charge back up to the programmable virtual ground 410 level. This is performed by the switching of the discharge 450 and isolation 470 transistors. In this case, R_W 460 goes inactive thus decoupling the system ground 430 from the local ground 440. R_W# 462 goes active coupling the global virtual ground 410 to the local ground 440.

In the embodiment illustrated, the charging of the local ground 440 to it's virtual ground value from the discharged value will require charging an effective capacitance on the local ground that is a function of the number of memory cells coupled to the local ground 440. The charging ability may be provided via two mechanisms. The first is through the leakage current as previously discussed. There is a second mechanism that is utilized in the charging of local grounds 440, however. When local ground 440 is coupled to the programmable virtual ground, there are a number of other local grounds coupled to the programmable virtual ground. Thus, there is the ability of these other local grounds and the programmable virtual ground to provide charging via charge sharing. This additional mechanism may increase the rate at which the local ground 440 will charge.

Figure 5:
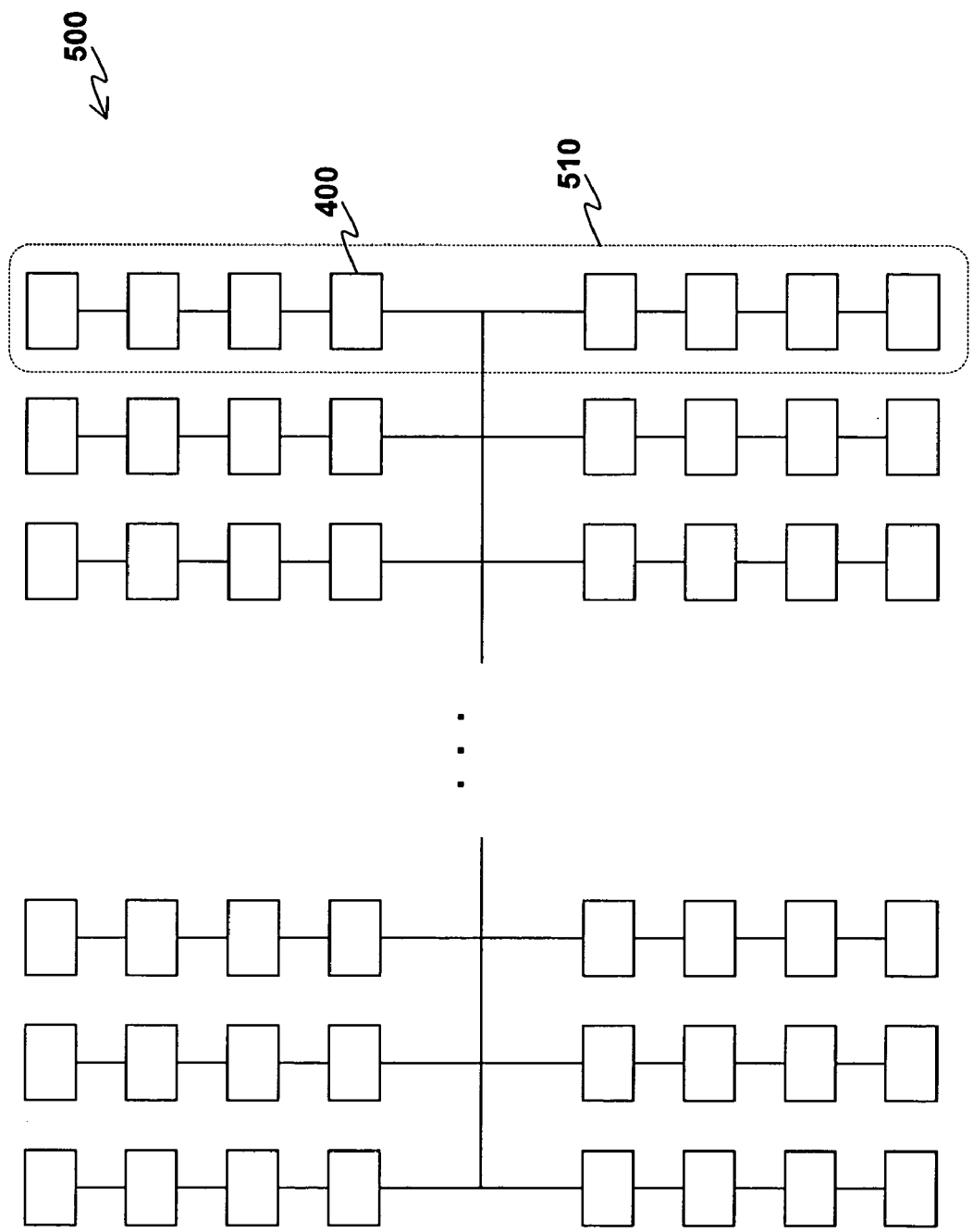
FIG. 5 illustrates a plurality of memory portions, such as those illustrated in FIG. 4.

FIG. 5 illustrates a plurality of memory portions 400, such as those illustrated in FIG. 4. In the embodiment illustrated the memory portions may be stacked to form memory slices 510. The slices may be combined to form a complete memory array 500. The programmable ground control circuitry utilized to provide the programmable virtual ground may be utilized to supply a virtual ground to any number of memory cells. That is, there may be programmable ground control circuitry for each memory portion 400. Alternatively there may be programmable ground control circuitry for a memory slice 510. Thus, the "size" of the memory or number of memory cells serviced by a programmable ground control circuit may vary. Generally speaking the smaller the number of memory cells serviced by a programmable ground control circuit, the quicker discharge of the local ground. As the number of memory cells increases, due to the loading on the local ground, the delay in discharge increases. Practically speaking, if the number of memory cells is too large, the delay in discharging the local ground may be too long, prohibiting the ability to discharge enough of the voltage prior to a read or write operation. Countering this is the fact that, each programmable ground control circuit requires resources. In the embodiment illustrated in FIG. 2, five transistors were required to implement a programmable ground control circuit. Thus, in order to prevent excessive utilization of resources by the programmable control circuits, the number of memory cells serviced by a programmable ground control circuit should not be too small. In one embodiment, a programmable ground control circuit is utilized to provide the programmable virtual ground to each 32k of memory cells. However, given that resource availability and timing requirements may have an effect on the implementation chosen, individual implementation requirements may vary.

The data provided for configuration bits 260 may be provided in a number of ways. In one embodiment, configuration bits 260 are driven by a fuse block containing fuses that are "blown", providing fixed values on the configuration bits 260. Devices containing such fuse driven configuration bits may be "blown" after electrical testing is performed on the memory device during wafer sort. The electrical testing may be utilized to determine a desired resistance based on measured parameters. Once the desired resistance is determined, the fuses can be "blown" accordingly to set the desired programmed value. In such an embodiment, after setting the programmed values, boundary scan could be used to override the blown values to experiment with other values, if desired.

In another embodiment, the configuration bits may be dynamically programmed. For example, as part of the power on diagnostics of a memory device containing the memory cells, values may be download to the memory device from another device containing the values. This other device may be a non-volatile memory device utilized to store the configuration bits. This other device may be periodically updated with new configuration bits as diagnostic information on the current consumption of the memory device is provided to a server. The server may then calculate the optimum resistance value for a desired current consumption and dynamically update the configuration bits in the non-volatile memory device. In yet another embodiment, the values may be stored in a control register in a memory device comprising the memory cells. The control register values are then provided as configuration bits to the programmable ground control circuit.

In various embodiments, memory devices containing more than one programmable ground control circuits may contain various programming methodology and values. Previously discussed are various methods for providing value to configuration bits of programmable ground control circuits. In various embodiments, one or a combination of these methods may be utilized. In addition, memory devices with multiple programmable ground control circuits may program the programmable ground control circuits with identical configuration information. Alternatively, due to various reasons such as process variations across a device comprising multiple programmable ground control circuits, each circuit may be programmed with different configuration information.

Figure 6:
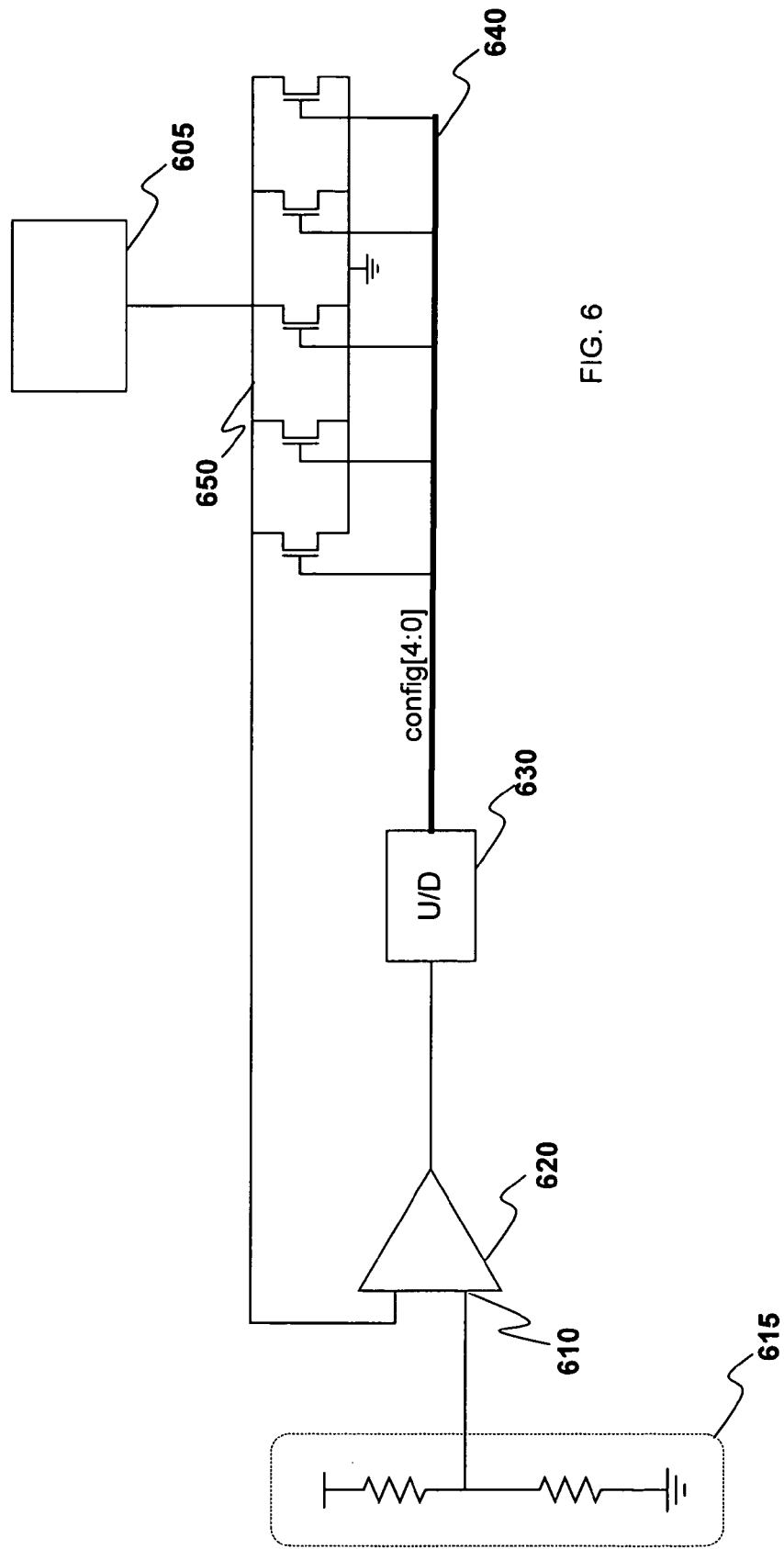
FIG. 6 illustrates a circuit utilized to regulate the programming of programmable ground control circuits.

FIG. 6 illustrates a circuit utilized to regulate the programming of programmable ground control circuits. In this embodiment, a dummy memory array 605 may be placed in a regulator circuit. For a variety of reasons, a dummy memory array, e.g. one that is not used to store data in normal circuit operation, may be utilized to supply leakage current in the regulator circuit. For example, a dummy memory array may be used in cases where sufficient resources exist and/or the dummy memory array may be placed in a convenient location. In other embodiments, a memory array used to store data in normal circuit operations may be utilized to provide leakage current for the regulator. The regulator circuit may include a feedback loop comprising a comparator 620 and an up/down counter 630. A reference voltage is provided on an input 610 to the comparator to indicate a desired ground voltage. The reference voltage may be derived internally in a device containing the regulator circuit. In one embodiment, a resistor divider 615 provides the reference voltage. In another embodiment, the reference voltage may be externally provided to an input to the device containing the regulator circuit. The up/down counter 630, based on the output from the comparator 620, counts up or down until the indicated ground voltage is achieved at virtual ground node 650. In one embodiment, the up/down counter 630 contains a filter to provide hysteresis to reduce frequent count changes on the outputs of the up/down counter 630. The output bits from the up/down counter 630 may be routed to all of the programmable ground control circuits on a memory device. Alternatively, the regulator circuit may be utilized for certain programmable ground control circuits while fuse block may be utilized for others.

Figure 7:
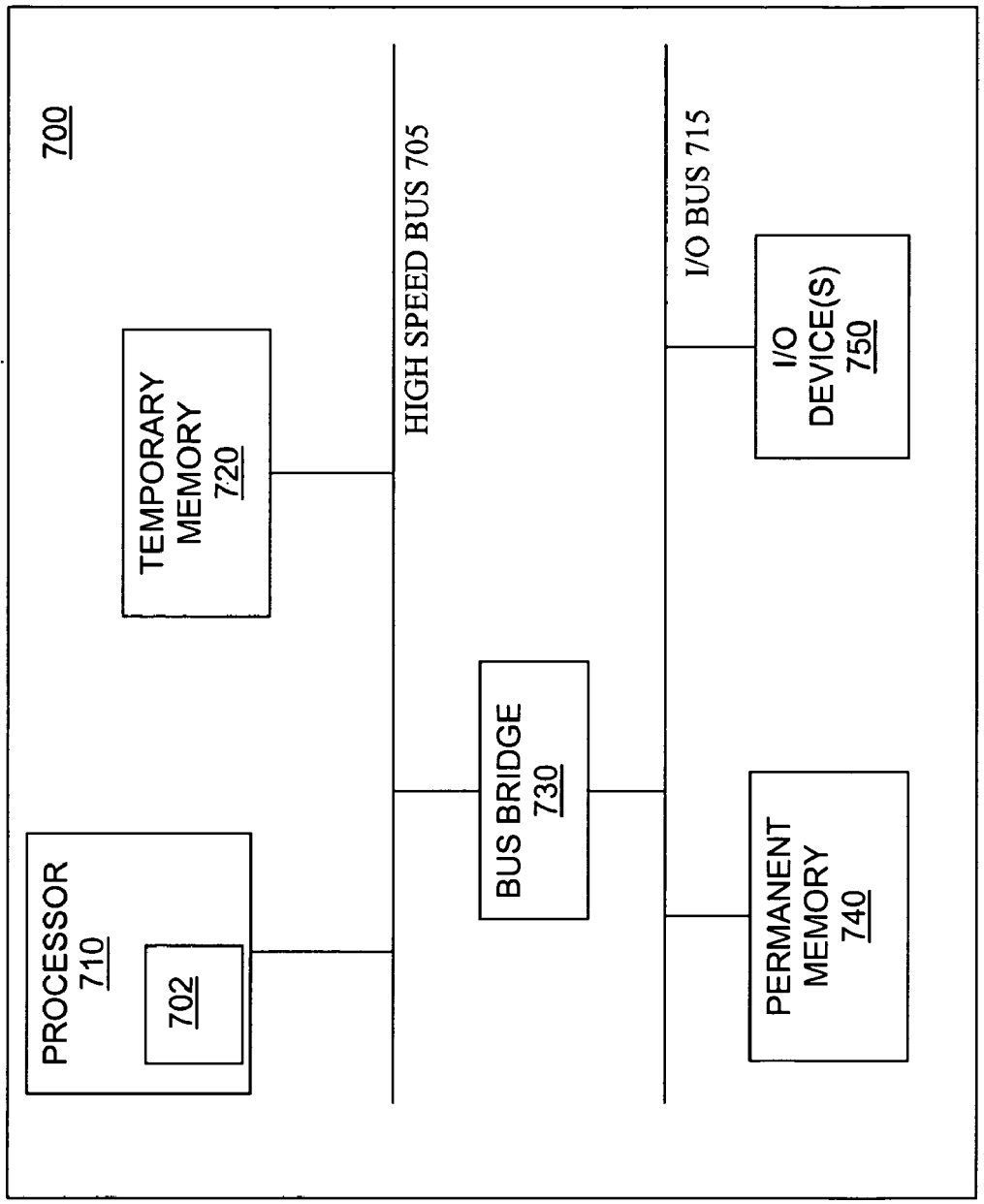
FIG. 7 illustrates a block diagram of a computer system including a processor with one or more memories incorporating programmable control of leakage current, in accordance with one embodiment.

FIG. 7 illustrates a block diagram of a computer system 700 including a processor 710 with one or more on-chip memories 702 incorporating programmable control of leakage current, in accordance with one embodiment. As shown, the computer system 700 includes a processor 710 and temporary off-chip memory 720, such as SDRAM and DRAM, on high-speed bus 705. High-speed bus is connected through bus bridge 730 to input/output (I/O) bus 715. I/O bus 715 connects permanent memory 740, such as flash devices and fixed disk device, and I/O devices 750, such as a networking interface, to each other and bus bridge 730. While the embodiment described in FIG. 7 illustrates a processor incorporating programmable control of leakage current for memories in the processor, it would be understood by those skilled in the art that the programmable control of leakage current could be practiced on temporary off-chip memories 720 and other memory devices on the system.

Thus, a unique method of controlling leakage current is disclosed. While the invention has been described in accordance with a number of embodiments, the invention should not be considered so limited. One skilled in the art will recognize that various other embodiments can be utilized to provide the advantages described herein.

The invention claimed is:

1. An apparatus comprising:
   a memory cell;
   ground control circuitry coupled to the memory cell to programmably control a voltage at a first ground;
   switch circuitry coupled to the memory cell to provide a first voltage to the memory cell during a first period, the first voltage referenced to the first ground; and to provide a second voltage to memory cell during a second period, the second voltage referenced to a second ground different from the first ground.

2. The apparatus of claim 1 wherein the ground control circuitry comprises a plurality of transistors coupled in parallel between the second ground and the first ground.

3. The apparatus of claim 2 wherein the plurality of transistors coupled in parallel comprise MOSFETs.

4. The apparatus of claim 2 wherein the plurality of transistors coupled in parallel comprise binary weighted transistors.

5. The apparatus of claim 2 wherein the plurality of transistors are adapted to be configured in response a configuration bit signal to provide a variable resistance between the first ground and the second ground.

6. The apparatus of claim 5 wherein each of the plurality of transistors has a resistance value, with the resistance value being weighted relative to the resistance values of the other transistors.

7. The apparatus of claim 5 wherein the plurality of transistors coupled in parallel comprise n-MOSFETs.

8. The apparatus of claim 1 wherein the first period comprises a period of non-access of the memory cell.

9. The apparatus of claim 1 wherein the second ground comprises a system ground.

10. An apparatus comprising:
    a memory cell coupled to a supply voltage; and
    a ground control circuitry coupled to the memory cell to programmably control a voltage at a ground, the ground control circuitry including a plurality of MOSFET devices that are binary weighted transistors.

11. The apparatus of claim 10 wherein the regulator circuit comprises:
    a comparator including a first input coupled to the first ground and a second input coupled to a reference voltage; and
    a counter coupled between an output of the comparator and the ground control circuitry.

12. The apparatus of claim 11 wherein a voltage divider provides the reference voltage.

13. The apparatus of claim 1 wherein the switch circuitry includes a first and a second transistor; the first transistor is adapted to couple the first ground to the memory cell during the first period and the second transistor is adapted to decouple the second ground from the memory cell during the first period; and the first transistor is adapted to decouple the first ground from the memory cell during the second period and the second transistor is adapted to couple the second ground to the memory cell during the second period.

14. An apparatus comprising:
    a memory cell coupled to a supply voltage; and
    a ground control circuitry to programmably control a voltage at a ground coupled to the memory cell, the ground control circuitry including a plurality of MOSFET devices that are binary weighted transistors.

* * * * *